(12) United States Patent
Hsu et al.

(10) Patent No.: US 10,090,289 B1
(45) Date of Patent: Oct. 2, 2018

(54) INTEGRATED CIRCUITS WITH STANDARD CELL

(71) Applicant: UNITED MICROELECTRONICS CORP., Hsin-Chu (TW)

(72) Inventors: Chen-Hsien Hsu, Hsinchu County (TW); Chien-Fu Chen, Miaoli County (TW); Cheng-Yang Tsai, Kaohsiung (TW); Wei-Jen Wang, Tainan (TW); Chao-Wei Lin, New Taipei (TW); Zhi-Hong Huang, Tainan (TW); Cheng-Tsung Ku, Taichung (TW); Chin-Sheng Yang, Hsinchu (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 15/813,163

(22) Filed: Nov. 15, 2017

(30) Foreign Application Priority Data

Sep. 18, 2017 (CN) .......................... 2017 1 0839608

(51) Int. Cl.
*H01L 27/02* (2006.01)
*H01L 23/522* (2006.01)
*H01L 27/088* (2006.01)
*H01L 23/528* (2006.01)

(52) U.S. Cl.
CPC ........ *H01L 27/0207* (2013.01); *H01L 23/528* (2013.01); *H01L 23/5226* (2013.01); *H01L 27/0886* (2013.01)

(58) Field of Classification Search
CPC ............... H01L 27/0207; H01L 23/528; H01L 23/5226; H01L 27/0886
See application file for complete search history.

(56) References Cited

U.S. PATENT DOCUMENTS

| | | | |
|---|---|---|---|
| 8,159,013 B2 | 4/2012 | Nishimura | |
| 8,504,972 B2 | 8/2013 | Hou | |
| 9,317,646 B2 | 4/2016 | Lu | |
| 9,368,484 B1 * | 6/2016 | Chen | H01L 27/0248 |
| 9,379,242 B1 * | 6/2016 | Lin | H01L 29/7847 |
| 9,385,236 B1 * | 7/2016 | Sun | H01L 29/7853 |
| 9,576,859 B2 * | 2/2017 | Tung | H01L 21/82382 |
| 9,653,402 B2 * | 5/2017 | Tseng | H01L 23/535 |
| 9,660,022 B2 * | 5/2017 | Liou | H01L 29/0649 |
| 9,698,047 B2 * | 7/2017 | Hung | H01L 29/7851 |
| 2012/0286331 A1 | 11/2012 | aton | |

* cited by examiner

*Primary Examiner* — John P Dulka
(74) *Attorney, Agent, or Firm* — Winston Hsu

(57) ABSTRACT

The present invention provides an integrated circuit with a dummy standard cell. The integrated circuit includes: a first metal line and a second metal line stretching along a first direction; a first dummy gate and a second dummy gate stretching along a second direction; Plural fin structures stretching along the first direction; A gate structure disposed on the fin structures and stretching along the second direction; Plural sets of short contact plug and long contact plug disposed between the first dummy gate, the second dummy gate and the gate structures; a doping region overlaps with the long contact plugs; a gate contact plug disposed on the gate structures; plural contact plugs disposed on and electrical contact the long contact plugs; A metal layer includes the first metal line, the second metal line.

20 Claims, 4 Drawing Sheets

INTEGRATED CIRCUITS WITH STANDARD CELL

BACKGROUND OF THE INVENTION

1. Field of the Invention

The present invention is related to an integrated circuit with a standard cell, and more particularly, to an integrated circuit with a standard filler cell or an edge standard filler cell.

2. Description of the Prior Art

Standard cells are composed of a set or a plurality of transistors which are connected to each other, being used to execute Boolean logic functions (such as AND, OR, XOR or XNOR) or can provide storage functions (as a flip-flop or a latch). With the advanced process technology, such as Fin-FET transistor, the layout design of the standard cells can be various.

The standard cell library provides the fundamental datum used to support the automation process for fabricating integrated circuits, as it can construct the entire integrated circuits automation process, from the front end simulation to the rear end layout implementation. Standard cell library includes a plurality of pre-designed standard cells, each containing a circuit layout pattern, the contours, the values of performance, the power dissipation, the time sequence, and the capability of the device, or other electrical performance values. Since the standard cell contains a common interface to achieve a regular structure, integrated circuit designers can conveniently select the standard cell from the library, and in accordance with the design requirements, to design the layout of the integrated circuits. The formation of the integrated circuit based on the standard cell library can greatly upgrade the design efficiency.

SUMMARY OF THE INVENTION

The present invention therefore provides an integrated circuit with a standard filler cell or an edge standard filler cell to give a useful tool for the integrated circuit designers.

According to one embodiment, the present invention provides an integrated circuit with a standard filler cell. The integrated circuits include a first metal line, a second metal line, a first dummy gate, a second dummy gate, a plurality of fin structures, a plurality of gate structures, a plurality of short contact plugs, a plurality of long contact plugs, a doping region, a gate contact plug, a plurality of via plugs and a metal layer. The first metal line and the second metal line extend along a first direction. The first dummy gate and the second dummy gate extend along a second direction, wherein a region encompassed by the first metal line, the second metal line, the first dummy gate and the second dummy gate is defined as a dummy standard cell region. The plurality of fin structures are disposed in the dummy standard cell region, wherein the fin structures are parallel to the first direction. The plurality of gate structures are disposed in the dummy standard cell region, being between the first dummy gate and the second dummy gate and parallel to the second direction. The plurality of short contact plugs and the plurality of long contact plugs disposed in the dummy standard cell region, wherein the long contact plugs and the short contact plugs are disposed between two of the gate structures or between one of the gate structures and the first dummy gate or the second dummy gate. The doping region is disposed between the dummy standard cell region and partially overlapped with the short contact plugs. The gate contact plug is disposed on the gate structure. The plurality of via plugs disposed on and electrically connected to the long contact plugs. The metal layer disposed on and electrically connected to the via plugs, wherein the metal layer comprises the first metal line and the second metal line.

According to one embodiment, the present invention provides an integrated circuit with an edge standard filler cell, including a metal line, a first dummy gate, a second dummy gate, a plurality of fin structures, a plurality of gate structures, a plurality of long contact plugs and a plurality of long via plugs. The metal line extends along a first direction. The first dummy gate and the second dummy gate extend along a second direction, wherein a region encompassed by the metal line, the first dummy gate and the second dummy gate is defined as an edge dummy standard cell region. The plurality of fin structures are disposed in the edge dummy standard cell region, wherein the fin structures are parallel to the first direction. The plurality of gate structures disposed in the edge dummy standard cell region, being between the first dummy gate and the second dummy gate and parallel to the second direction. The plurality of long contact plugs disposed in the edge dummy standard cell region, wherein the long contact plugs are disposed between two of the gate structures or between one of the gate structures and the first dummy gate or the second dummy gate. The plurality of long via plugs disposed in the edge dummy standard cell region, being disposed on and electrically connected to the long contact plugs, wherein components in the edge dummy standard cell region are mirror symmetrical to each other.

The integrated circuits with a standard filler cell or with an edge standard filler cell can be used to fill the spaces in the logical circuits according to the arrangement of other devices in the logical circuits so as to compensate the density of the entire logical circuits, thereby improving the uniformity of the logical circuits.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the presented invention, preferred embodiments will be described in detail. The preferred embodiments of the present invention are illustrated in the accompanying drawings with numbered elements.

Figure 1:
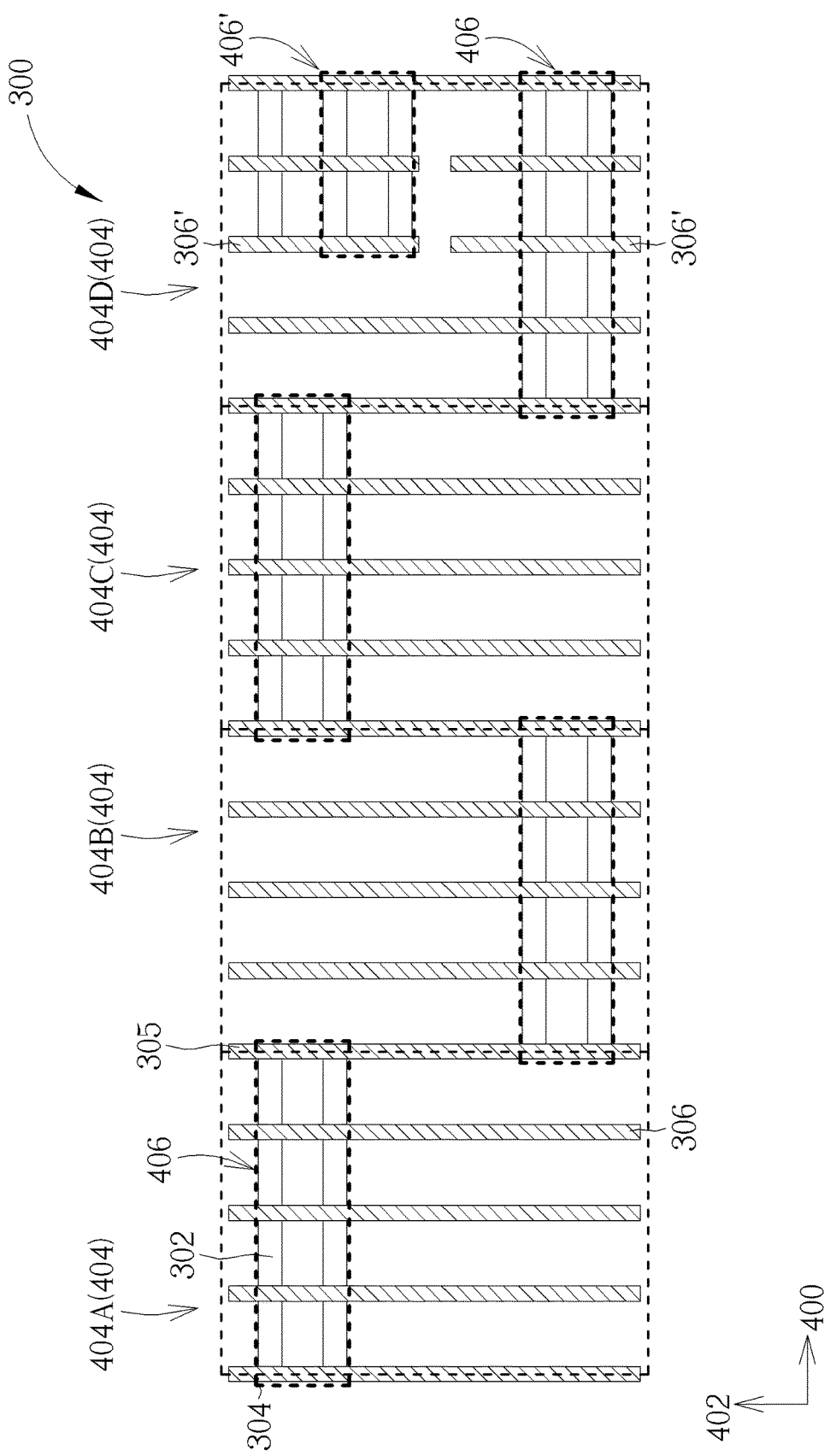
FIG. 1 to FIG. 3 show schematic diagrams of the integrated circuits with a standard filler cell.
Figure 2:
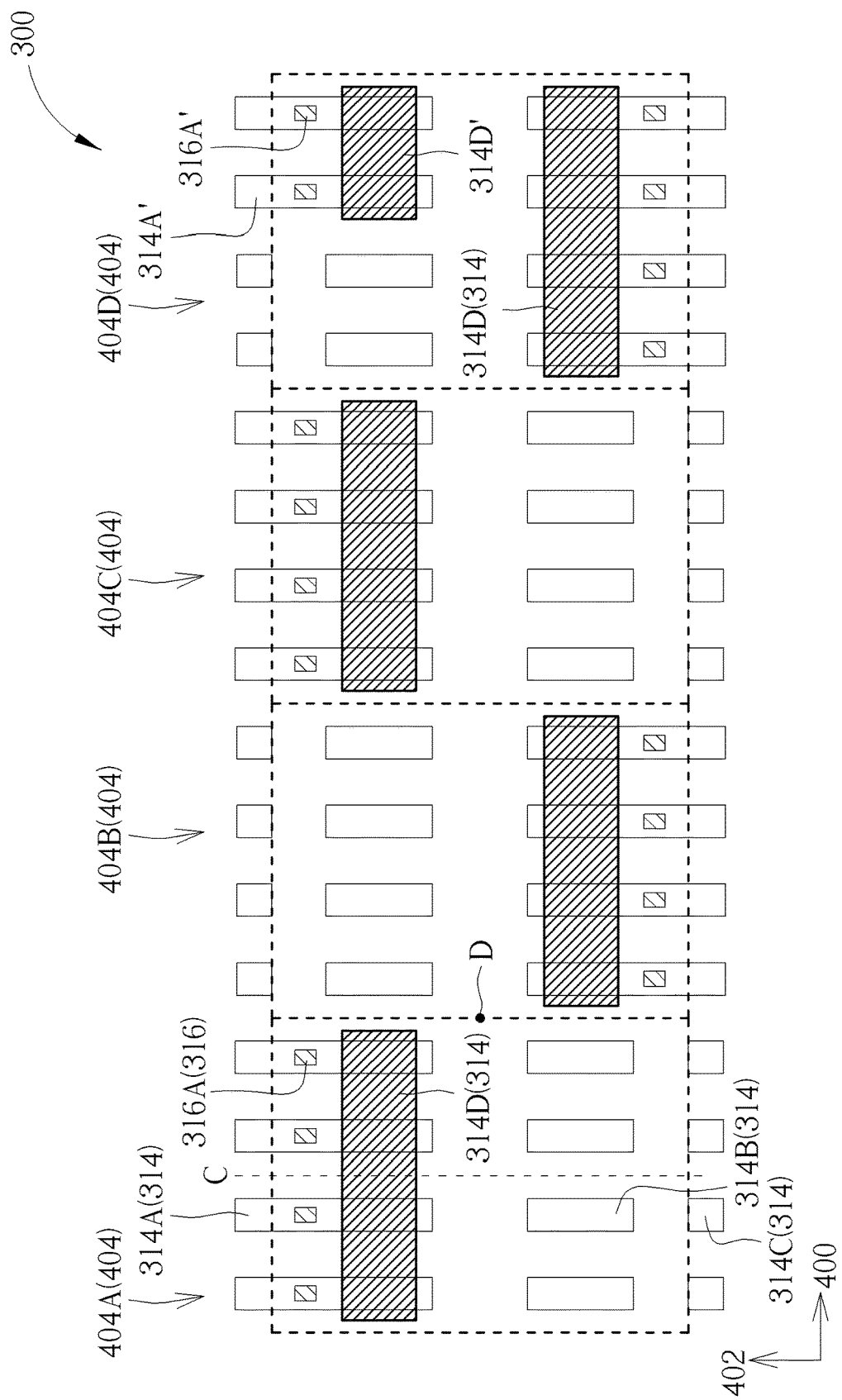
Figure 3:
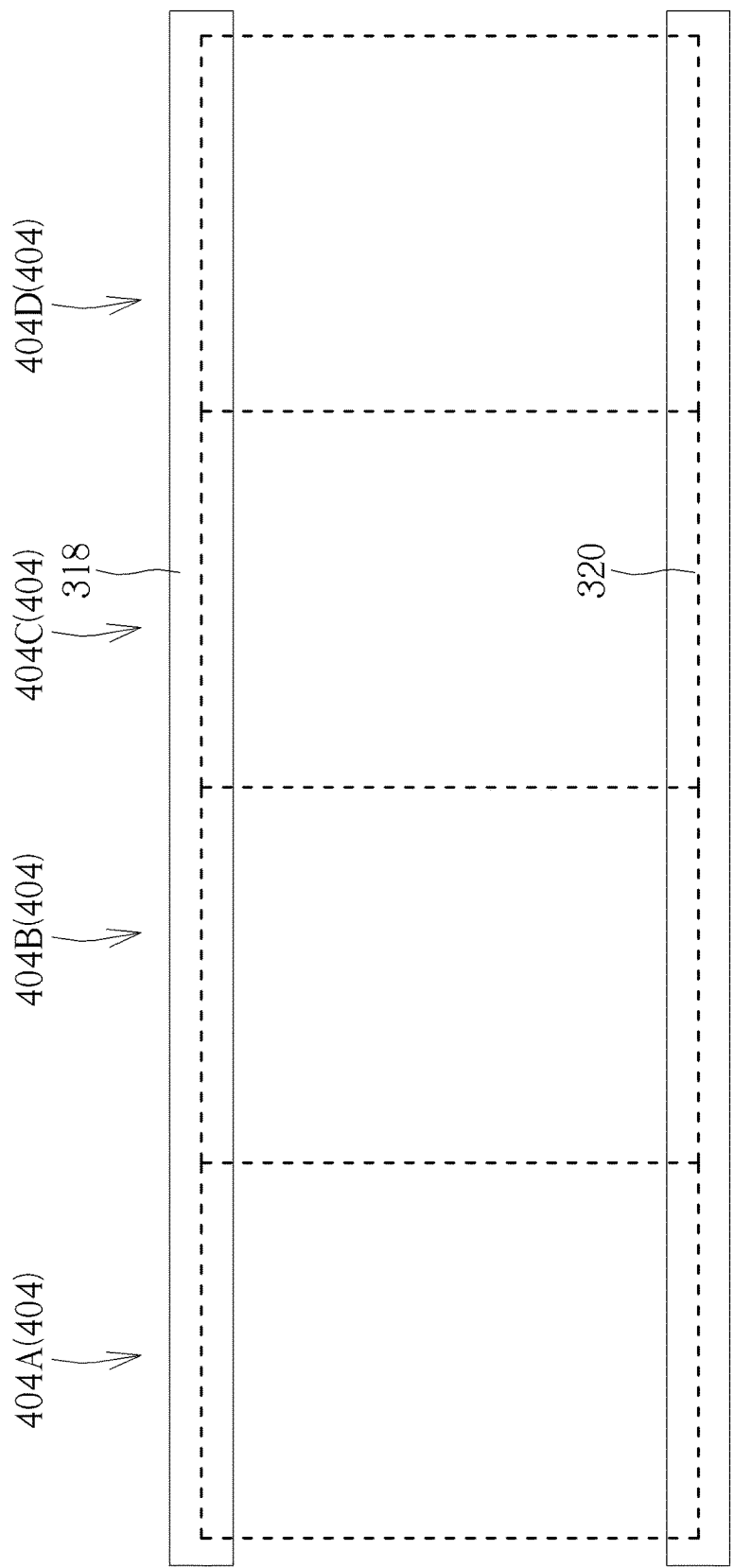

Please refer to FIG. 1 to FIG. 3, which show schematic diagrams of the integrated circuits with a standard filler cell. The integrated circuits include fin structures, dummy gates, gate structure, contact plugs, via plugs and metal lines. In order to correctly point out the relative vertical positions of each components, the components of the standard filler cell are split into three parts and are presented from bottom to top in FIG. 1, FIG. 2 and FIG. 3. Please see FIG. 1 first. The standard filler cell is disposed on a substrate 300. The substrate 300 can include a semiconductor material, such as a silicon substrate, an epitaxial silicon substrate, a silicon germanium substrate, a silicon carbide substrate, a single crystal silicon substrate, a single crystal silicon germanium substrate, an amorphous silicon substrate, or a silicon on insulator (SOI), but it is not limited thereto. The substrate 300 has one or more than one dummy standard cell regions 404 for forming standard filler cells. Taking the leftmost dummy standard cell region 404A for example, the dummy standard cell region 404A can be a rectangular shape having a set of sides parallel to a first direction 400 and the other set of sides parallel to a second direction 402. A doping region 406 is disposed at one side of the dummy standard cell region 404A.

As shown in FIG. 1, the standard filler cell of the present embodiment further includes a plurality of fin structures 302, which are disposed on the substrate 300 and are extending along the first direction 400, being arranged evenly in the dummy standard cell region 404A. In one embodiment, there are six fin structures 302 located in dummy standard cell region 404A, but the number thereof can be adjusted so as to change a length of the dummy standard cell region 404A (the "length" means the set of edges parallel to the second direction 402). The fin structures 302 in doping region 406 can have appropriate dopants. In one embodiment, the dopants are P type dopants such as boron (B), aluminum (Al) or gallium (Ga), while in another embodiment, the dopants are N type dopants such as phosphorus (P), arsenic (as) or antimony (Sb), but are not limited thereto. A first dummy gates 304, a second dummy gates 305 and a plurality of gate structures 306 are disposed on the fin structures 302, all of which extend along the second direction 402, wherein the first dummy gate 304, the second dummy gate 305 are disposed at two sides of the dummy standard cell region 404, while the gate structures 306 are disposed between the first dummy gate 304 and the second dummy gate 305. In one embodiment, there are three gate structures 306, but the number of the gate structures 306 can be adjusted so as to change a width of the dummy standard cell region 404A (the "width" means the set of edges parallel to the first direction 400). In one embodiment, the first dummy gate 304, the second dummy gate 305 and the gate structures 306 can be formed simultaneously through a same fabrication processes, for example, by a conventional polysilicon process, or an advanced metal gate process, so the cross section of the gates may include gate dielectrics (not shown) and metal layers (not shown).

Please refer to FIG. 2. A plurality of contact plugs (also called "slot contacts") 314 are disposed over the fin structures 302, the first dummy gate 304, the second dummy gate 305 and the gate structures 306 to form the external electrical connections. The contact plugs 314 include: four long contact plugs 314A, four short contact plugs 314B, four dummy contact plugs 314C and a gate contact plug 314D. Please refer to both FIG. 1 and FIG. 2. There is one long contact plug 314A, one short contact plug 314B and one dummy contact plug 314C located between each two gate structures 306, or between one of the gate structures 306 and the first dummy gate 304 or the second dummy gate 305, and the projections of the said long contact plug 314A, said short contact plug 314B and the dummy contact plug 314C along the first direction 400 completely coincide with each other (i.e. they are at the same line). From the view of the second direction 402, said long contact plugs 304A extends across the doping region 406 and further extends upwardly to outsides of the dummy standard cell region 404A; said short contact plug 314B and said dummy contact plug 314C are located at the other side of the dummy standard cell region 404A, wherein only a small portion of the dummy contact plug 314C is located within the dummy standard cell region 404A. In one preferred embodiment of the present invention, the long contact plugs 314A, the short contact plugs 314B and the dummy contact plugs 314C can be formed through one or more than one photo-etching-process (PEP) by using two or more than two mask layers. For example, a first patterned mask layer (not shown) with a plurality of trenches having the same size as the long contact plugs 314A is formed, then a second patterned mask layer (not shown) is formed to fill into parts of the trenches, separating the trenches and thus forming the short contact plugs 314B and dummy contact plugs 314C. Accordingly, the length of the long contact plugs 314A is equal to the distance of the two most distant edges of the short contact plug 314B and the dummy contact plug 314C. The gate contact plug 314D is electrically connected to all of the gate structures 306. In one embodiment, the holes of the gate contact plug 314D, the long contact plugs 314A, the short contact plugs 314B and the dummy contact plugs 314C can be fabricated by different processes, but they can be filled with the same metal layer and then polished, thus can be formed simultaneously. Accordingly, the gate contact plug 314D, the long contact plugs 314A, the short contact plugs 314B and the dummy contact plugs 314C have the same height of the top surface. It is understood that the layout of the digital circuit is composed of various standard cell regions 404A. The dummy contact plugs 314C will not be located in the standard cell region 404A of the digital circuits, instead, the dummy contact plugs 314C will be only appeared in the peripheral region of the digital circuits. Subsequently, a plurality of via plugs 316 are formed on the long contact plugs 314A. The via plugs 316 include: four long via plugs 316A corresponding to the long contact plugs 314A. It is noted that there are no via plugs connecting to the short contact plugs 314B, the dummy contact plugs 314C and the gate contact plug 314D, so the short contact plugs 314B, the dummy contact plugs 314C and the gate contact plug 314D are electrically floating.

As shown in FIG. 3, the plurality of via plugs 316 connect upwardly to a first metal line 318 and a second metal line 320. The first metal line 318 and the second metal line 320 extend parallel to the second direction 402, and a central line of the first metal line 318 corresponds to the short edge of the dummy standard cell region 404A, a central line of the second metal line 320 corresponds to the other short edge of the dummy standard cell region 404. The first metal line 318 connects to all of the long via plugs 316A while the second metal line 320 connects to no long via plug 316A. When the first metal line 318 is applied to $V_{DD}$, the second metal line 320 is applied to $V_{SS}$, since there is no via plugs connected to the gate contact plugs 314D, no transistor is turned on and no active circuits will be established, thus making the components of the circuits being dummy.

It is noted that the components in the dummy standard cell region 404A are mirror symmetrical to each other along a middle axis C which is parallel to the second direction 402 (the middle axis C is shown in FIG. 2), making the components in the dummy standard cell region 404A easily formed without affecting by the fabrication method. In another embodiment, the components of the third dummy standard cell region 404C are identical to the components of the dummy standard cell region 404A. Besides, depending on the requirement of the circuit design, the dummy standard cell can be incorporated with other logical standard cells and/or other dummy standard cells. As shown in FIG. 1, FIG. 2, FIG. 3, there are four dummy standard cell regions, 404A, 404B, 404C and 404D. In one embodiment, the components in the dummy standard cell region 404A are 180 degrees rotationally symmetrical relating to a center D with the components in the dummy standard cell region 404B, also making other logically device not greatly affected by the components in the dummy standard cell regions 404. Considering the situation that the components in the dummy standard cell regions 404 are too concentrated at one side, the present invention further provides a dummy standard cell region 404D that can compensate the density of the components in adjacent regions. Please refer to dummy standard cell region 404D in FIG. 1, FIG. 2 and FIG. 3. Bides the original doping region 406 disposed at one side of the dummy standard cell region 404D, there can be an adjust doping region 406' at the other side of the dummy standard cell region 404D, wherein a projection of the adjust doping region 406' along the first direction 400 partially overlaps with a projection of the doping region 406 along the first direction 400, and in one embodiment, the overlapping ratio is 1/2. In another embodiment, the doping region 406 can be reduced to 1/2 region when there is no doping region at the other side. Parts of the gate structures 306 (for example, two of the three gate structures 306) can be divided into two separated adjust gate structures 306'. In the previous embodiment, the number of the short contact plugs 314B is equal to the number of the long contact plugs 314A. In this embodiment, the number of the long contact plugs 314A can be greater than the number of the short contact plugs 314B. That is, besides the long contact plugs 314A, the long via plugs 316A and the gate contact plug 314D at one side, the short contact plugs 314B at the other side can be changed to the long contact plugs 314A, the long via plugs 316A and the gate contact plug 314D. For example, a half of the short contact plugs 314B are changed to the long contact plugs 314A, the long via plugs 316A and the gate contact plug 314D, making the projections of the long contact plugs 314A, the long via plugs 316A and the gate contact plug 314D at one side of the dummy standard cell region 404D along the first direction 1/2 overlaps with the projection of the long contact plugs 314A, the long via plugs 316A and the gate contact plug 314D at the other side of the dummy standard cell region 404D. In another embodiment, the number of the long contact plugs 314A can be less than the number of the short contact plugs 314B. That is, the number of the long contact plugs 314A, the long via plugs 316A and the gate contact plug 314D at one side is reduced to 1/2, and the rest is replaced by the short contact plugs 314B and the dummy contact plugs 314C. It is noted that, the replaced components are preferably adjacent to each other and the replace ratio can be adjust arbitrarily according to the design of the products.

Figure 4:
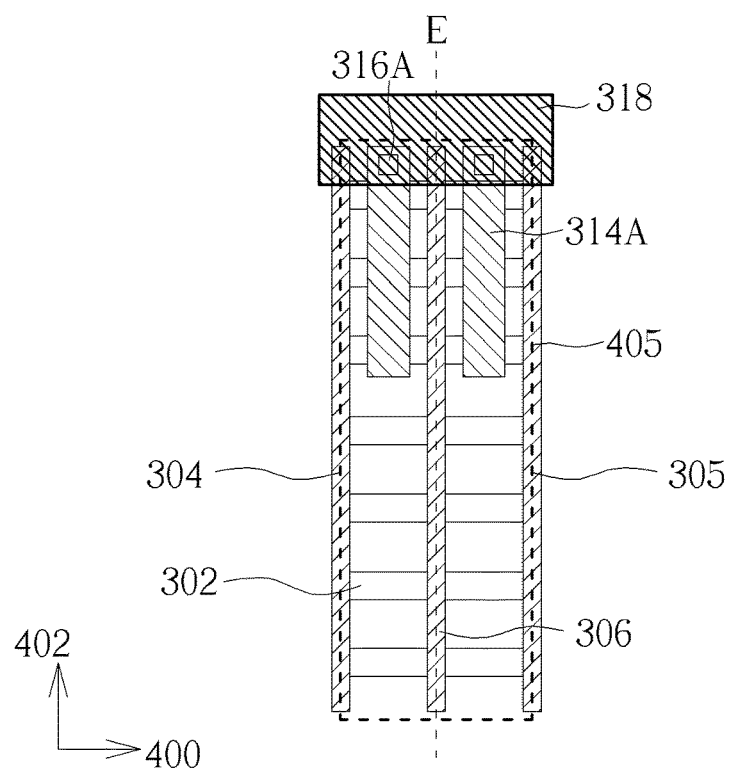
FIG. 4 shows a schematic diagram of the integrated circuits with an edge standard filler cell.
Figure 5:
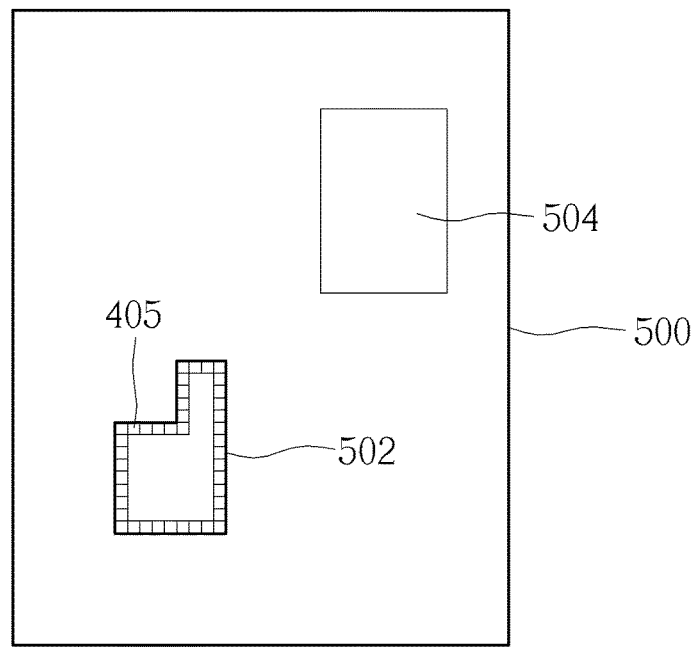
FIG. 5 shows a schematic diagram of the position of the edge standard filler cell.

Please refer to FIG. 4, showing an integrated circuits with an edge standard filler cell disposed in an edge dummy standard cell region 405. As shown in FIG. 4, the integrated circuit including a plurality of fin structures 302, a first metal line 318, a first dummy gate 304, a second dummy gate 305, a gate structure 306, a plurality of long contact plugs 314A, a plurality of long via plugs 316A. The fin structures 302 extend along a first direction 400, the first dummy gate 304 and the second dummy gate 305 extend along a second direction 402 and are disposed correspond to the two long edges of the edge dummy standard cell region 405. The gate structure 306 is disposed between the first dummy gate 304 and the second dummy gate 306 and is parallel to the second direction 402. The plurality of long contact plugs 314A are disposed between two of the gate structure 306, the first dummy gate 304 and the second dummy gate 305, thus directly contacting the below fin structures 302. The plurality of long via plugs 316A are disposed on and electrically connected to the long contact plugs 314A. The first metal line 318 is parallel to the first direction 400 and located at the short edge of the edge dummy standard cell region 404. The edge standard filler cell is mainly located at the peripheral part of the logical region. Please refer to FIG. 5, which shows a schematic diagram of the position of the edge dummy standard cell region. As shown in FIG. 5, a chip 500 includes a logical region 502 and other electrical device region (such as a memory region 504). The edge dummy standard cell regions 405 are preferably located at the most peripheral part of the logical region 502, so the logical region 502 can be encompassed by the edge standard filler cells. In another embodiment, the edge standard filler cell can omit the fin structures 302.

The integrated circuits with a standard filler cell or with an edge standard filler cell can be used to fill the spaces in the logical circuits according to the arrangement of other devices in the logical circuits so as to compensate the density of the entire logical circuits, thereby improving the uniformity of the logical circuits.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An integrated circuit with a standard filler cell, comprising:
    a first metal line and a second metal line, extending along a first direction;
    a first dummy gate and a second dummy gate, extending along a second direction, wherein a region encompassed by the first metal line, the second metal line, the first dummy gate and the second dummy gate is defined as a dummy standard cell region;
    a plurality of fin structures disposed in the dummy standard cell region, wherein the plurality of fin structures are parallel to the first direction;
    a plurality of gate structures disposed in the dummy standard cell region, being between the first dummy gate and the second dummy gate and parallel to the second direction;
    a plurality of short contact plugs and a plurality of long contact plugs disposed in the dummy standard cell region, wherein the plurality of long contact plugs and the plurality of short contact plugs are disposed between two of the plurality of gate structures, or between one of the plurality of gate structures and the first dummy gate, or between one of the plurality of gate structures and the second dummy gate;
    a doping region, disposed in the dummy standard cell region and partially overlapped with the plurality of long contact plugs;
    a gate contact plug disposed on the gate structure;
    a plurality of via plugs disposed on and electrically connected to the plurality of long contact plugs; and
    a metal layer disposed on and electrically connected to the plurality of via plugs, wherein the metal layer comprises the first metal line and the second metal line.

2. The integrated circuit according to claim 1, wherein the standard filler cell has a middle axis paralleled to the second direction, and components of the integrated circuit in the dummy standard cell region are mirror symmetrical to each other relating to the middle axis.

3. The integrated circuit according to claim 1, further comprising a second dummy standard cell region, disposed adjacent to the dummy standard cell region and directly contacts the dummy standard cell region.

4. The integrated circuit according to claim 3, wherein components in the dummy standard cell region are rotationally symmetrical to components in the second dummy standard cell region.

5. The integrated circuit according to claim 4, wherein components in the dummy standard cell region are 180 degrees rotationally symmetrical to components in the second dummy standard cell region.

6. The integrated circuit according to claim 1, further comprising a third dummy standard cell region, wherein components of the third dummy standard cell region are identical to components of the dummy standard cell region, and the third dummy standard cell region does not contact the dummy standard cell region.

7. The integrated circuit according to claim 1, wherein the two long contact plugs further extend to outside of the dummy standard cell region.

8. The integrated circuit according to claim 1, wherein each of the plurality of gate structures comprises two separated adjust gate structures.

9. The integrated circuit according to claim 1, further comprising an adjust doping region disposed in the dummy standard cell region, and a projection of the adjust doping region along the first direction partially overlaps with a projection of the doping region along the first direction.

10. The integrated circuit according to claim 9, wherein an overlapping ratio is 1/2.

11. The integrated circuit according to claim 1, further comprising an adjust gate contact plug disposed in the dummy standard cell region, and a projection of the adjust gate contact plug along the first direction partially overlaps with a projection of the gate contact plug along the first direction.

12. The integrated circuit according to claim 11, wherein an overlapping ratio is 1/2.

13. The integrated circuit according to claim 1, further comprising an adjust via plug disposed in the dummy standard cell region, and a projection of the adjust via plug along the first direction partially overlaps with a projection of the via plugs along the first direction.

14. The integrated circuit according to claim 1, wherein a number of the plurality of short contact plugs is equal to a number of the plurality of long contact plugs, so there are one short contact plug and one long contact plug between two of the plurality of gate structures or between one of the gate structure and the first dummy gate or the second dummy gate.

15. The integrated circuit according to claim 1, wherein a number of the plurality of short contact plugs is less than a number of the long contact plugs, so there are one short contact plug and one long contact plug or two long contact plugs between two of the plurality of gate structures or between one of the gate structure and the first dummy gate or the second dummy gate.

16. The integrated circuit according to claim 1, wherein a number of the plurality of short contact plugs is greater than a number of the plurality of long contact plugs, so there are one short contact plug and one long contact plug or two short contact plugs between two of the plurality of gate structures or between one of the plurality of gate structures and the first dummy gate or the second dummy gate.

17. An integrated circuit with an edge standard filler cell, comprising:
    a metal line, extending along a first direction;
    a first dummy gate and a second dummy gate, extending along a second direction, wherein a region encompassed by the metal line, the first dummy gate and the second dummy gate is defined as an edge dummy standard cell region;
    a plurality of fin structures disposed in the edge dummy standard cell region, wherein the plurality of fin structures are parallel to the first direction;
    a plurality of gate structures disposed in the edge dummy standard cell region, being between the first dummy gate and the second dummy gate and parallel to the second direction;
    a plurality of long contact plugs disposed in the edge dummy standard cell region, wherein the plurality of long contact plugs are disposed between two of the gate structures or between one of the plurality of gate structures and the first dummy gate or the second dummy gate; and
    a plurality of long via plugs disposed in the edge dummy standard cell region, being disposed on and electrically connected to the plurality of long contact plugs, wherein components in the edge dummy standard cell region are mirror symmetrical to each other.

18. The integrated circuit according to claim 17, wherein the plurality of long contact plugs further extend to outside of the edge dummy standard cell region.

19. The integrated circuit according to claim 17, wherein the plurality of long contact plugs, the plurality of long via plugs and the metal line are disposed at one side of the edge dummy standard cell region.

20. The integrated circuit according to claim 17, further comprising a logic region with a plurality of edge dummy standard cell regions, and the plurality of edge dummy standard cell regions are disposed at edges of the logic region.

* * * * *